United States Patent [19]
Lewis et al.

[11] Patent Number: 4,792,786
[45] Date of Patent: Dec. 20, 1988

[54] SURFACE-MOUNTED SINGLE PACKAGE DATA ACQUISTITION SYSTEM

[75] Inventors: Charles H. Lewis, Fife; James P. Edgar, Edinburgh, both of Scotland; Heinz-Juergen Metzger, Pliezhausen, Fed. Rep. of Germany

[73] Assignee: Burr-Brown Limited, Livingston, Scotland

[21] Appl. No.: 166,735

[22] Filed: Mar. 2, 1988

Related U.S. Application Data
[63] Continuation of Ser. No. 894,063, Aug. 7, 1986.

[30] Foreign Application Priority Data
Mar. 5, 1986 [GB] United Kingdom ............... 8610893

[51] Int. Cl.$^4$ .................................................. H03M 1/00
[52] U.S. Cl. ................................................... 341/133
[58] Field of Search ................................. 340/347 AD

[56] References Cited
PUBLICATIONS
Bernstein, "Electronics", Jan. 19, 1978, pp. 113-119.
No Author stated, "Computer Design", Jan. 1977, pp. 128-129, Analog Subsystem Provides I/O Interface to Intel SBC-80/10.
No Author stated, "Computer Design", Jul. 1978, pp. 120 & 122, 12-Bit D-A and A-D Converters Add Analog Input, Etc.
No Author stated, "Computer Design", Dec. 1978, pp. 134 & 136, Analog I/O Board Includes Digitally Controller Amplifier.

*Primary Examiner*—Charles D. Miller
*Attorney, Agent, or Firm*—Victor Flores

[57] ABSTRACT

Integrated circuits in the form of a multiplexer, an instrumentation amplifier, a sample-and-hold amplifier, and an A/D converter are mounted on a single substrate, forming a data acquisition system capable of selecting one of a number of analog signals and converting it into a digital number. The resulting package is mounted in a leadless chip carrier (LCC) suitable for surface mounting.

5 Claims, 8 Drawing Sheets

SURFACE-MOUNTED SINGLE PACKAGE DATA ACQUISITION SYSTEM

This is a continuation of co-pending application Ser. No. 894,063 filed on 08-07-86.

TECHNICAL FIELD

This invention relates generally to circuitry for selecting one of a number of analog signals and converting it into a digital number, and, in particular, to a single package data acquisition system which may be mounted in a leadless chip carrier (LCC) suitable for surface mounting.

BACKGROUND OF THE INVENTION

The present invention concerns an improvement in a data acquisition system. Data acquisition systems are well known in which an analog signal is sampled, amplified, temporarily stored, and finally converted into a digital signal of corresponding or proportionate value.

It is also known to provide a data acquisition system in a single module in the form of a printed wiring board.

However, to reduce the cost and size of such systems, there is an urgent need in this technology to provide a yet more compact and easily mounted circuit package for a data acquisition system of the type described hereinabove.

BRIEF SUMMARY OF INVENTION

Accordingly, it is an object of the present invention to provide an improved data acquisition system.

It is also an object of the present invention to provide a data acquisition system which is formed on a single non-conducting substrate.

It is a further object of the present invention to provide a data acquisition system comprising a plurality of integrated circuits mounted on a single non-conducting substrate.

It is yet another object of the present invention to provide a data acquisition system which is formed on a single non-conducting substrate and which is capable of being electrically coupled to an external circuit package either by surface mounting or by socket mounting.

These and other objects are achieved in accordance with a preferred embodiment of the invention by providing a data acquisition system mounted on a single substrate of non-conducting material, and comprising means for receiving at least one analog signal input; means for amplifying said analog signal; means for temporarily storing said amplified analog signal; and means for converting said amplified analog signal into a digital signal of proportionate value.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE INVENTION

Figure 1:
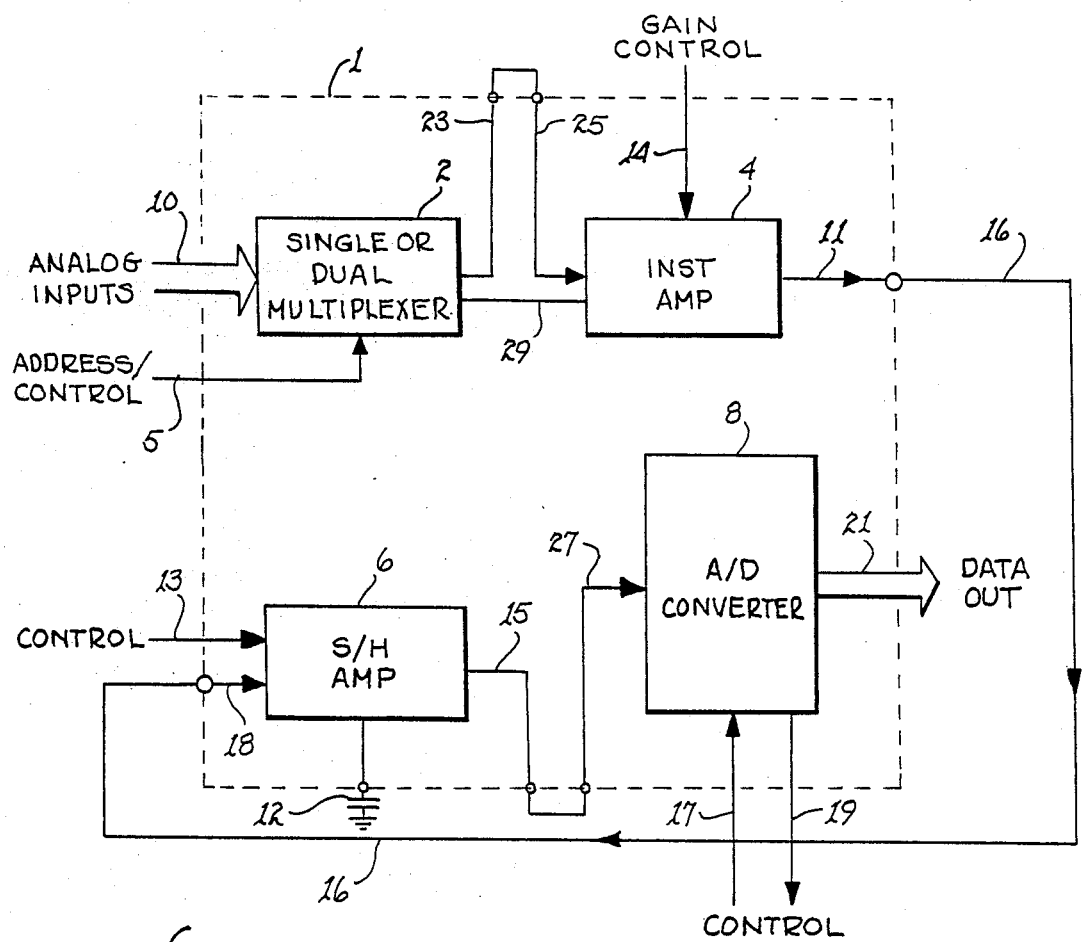
FIG. 1 shows a block diagram illustrating a preferred embodiment of the surface-mounted single package data acquisition system of the present invention.

Referring now to FIG. 1, a block diagram is shown illustrating a preferred embodiment of a surface-mounted single package data acquisition system according to the present invention.

The system comprises as basic components thereof a single or dual multiplexer 2, an instrumentation amplifier 4, a sample-and-hold amplifier 6, and an A/D converter 8. The basic components are contained on a unitary substrate of non-conducting material whose boundary is indicated by the broken line 1

In the case of the single N-channel multiplexer 2, a set of analog inputs in the form of N channels which are input by a multi-conductor bus 10, form the inputs to the system. In the case of the dual N/2-channel multiplexer 2, a first set of analog inputs in the form of N/2 channels of high level signals, are input via portion 3 of multi-conductor bus 10 (refer to FIG. 2A), and a second set of analog inputs in the form of N/2 channels of low level signals, are input via portion 7 of multi-conductor bus 10.

Multiplexer 2 is also responsive to address and/or control signals input over bus 5. The address signals select an appropriate analog signal inputs for sampling. The control signal serves to enable/disable the multiplexer operation.

Multiplexer 2 generates a resultant analog signal to instrumentation amp 4. In the case of the single analog input multiplexer, the resultant analog signal is routed through conductor 29. In the case of the dual analog input multiplexer, the resultant negative analog signal is routed via conductors 23 and 25 with an external connection to the system.

The instrumentation amplifier 4 is capable of variable gain, which is defined by applying jumpers to external pins on the system via multi-conductor gain control bus 14.

The resultant analog output signal from the instrumentation amplifier 4 is routed to an external pin on the system via conductor 11. This signal is routed via an external connection to conductor 18, which forms the input signal route to the sample/hold amplifier 6. The sample/hold amplifier 6 has connected to it a capacitor 12 on which the analog signal is temporarily stored. A control signal on lead 13 into the sample/hold amplifier 6 serves to control the timing of the analog signal on the hold capacitor 12. This control signal may in fact be generated by the A/D converter 8 via, for example, conductor 19.

The output of sample-and-hold amp 6 is routed via conductor 15 to an external pin. An external connection is made to conductor 17, which acts as the input to the A/D converter 8. A/D converter 8 receives any of several possible control signals via conductor 17. A/D converter 8 converts the analog signal received via conductor 27 into a multiple-bit digital signal, which is output via data bus 21.

Figure 2A:
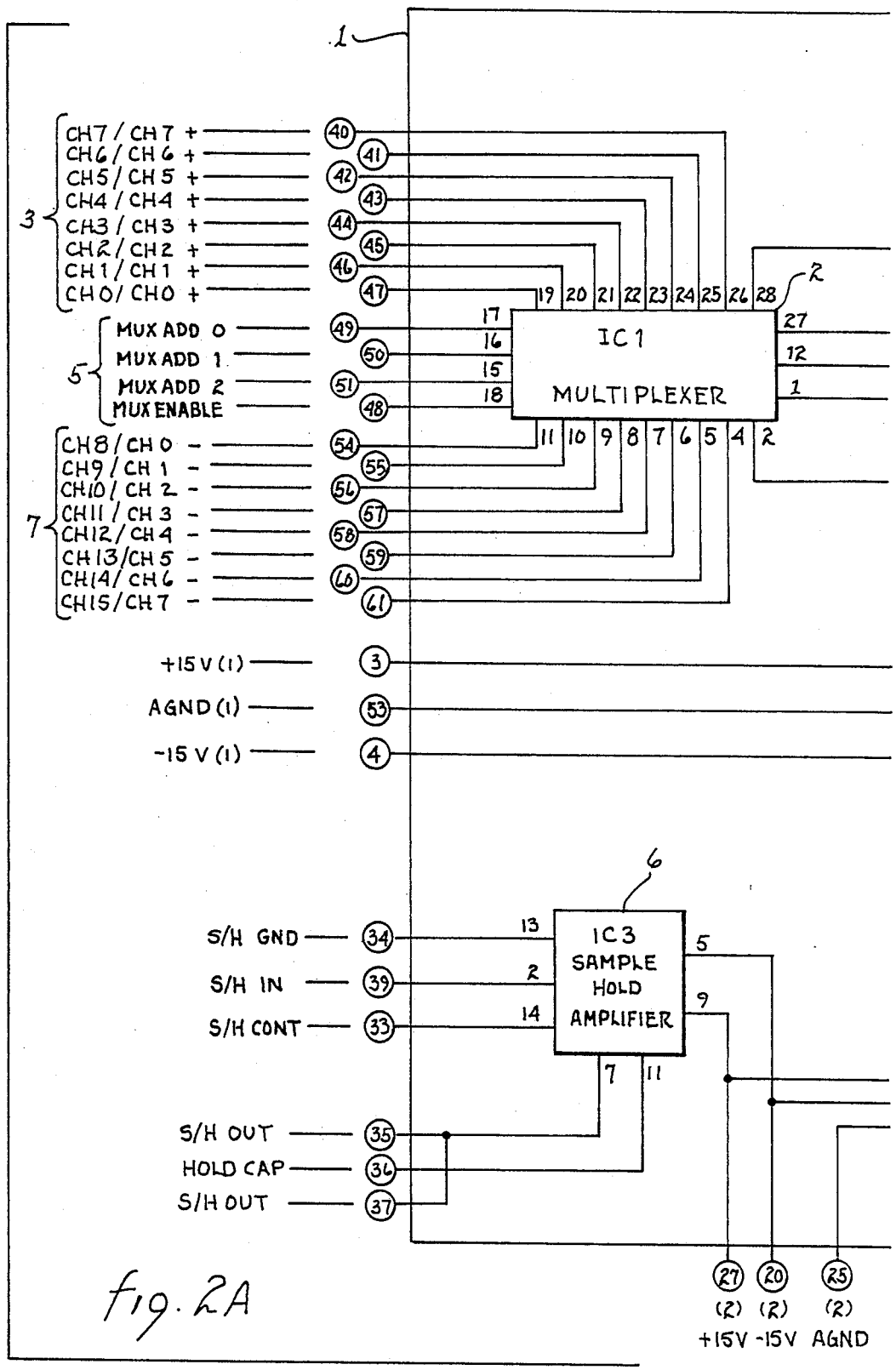
FIGS. 2A–2C together show a circuit schematic of the surface-mounted single package data acquisition system of the present invention.
Figure 2B:
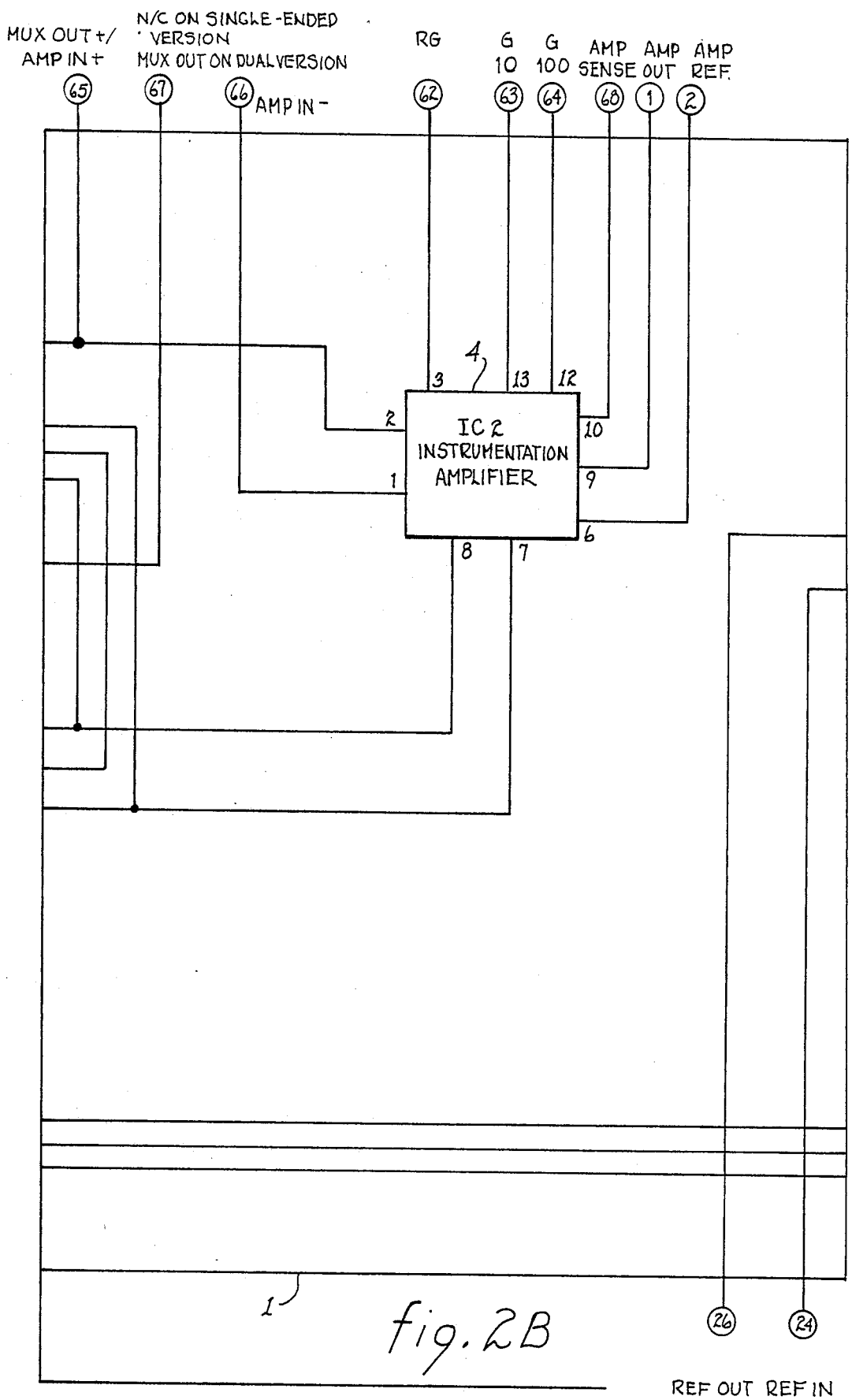
Figure 2C:
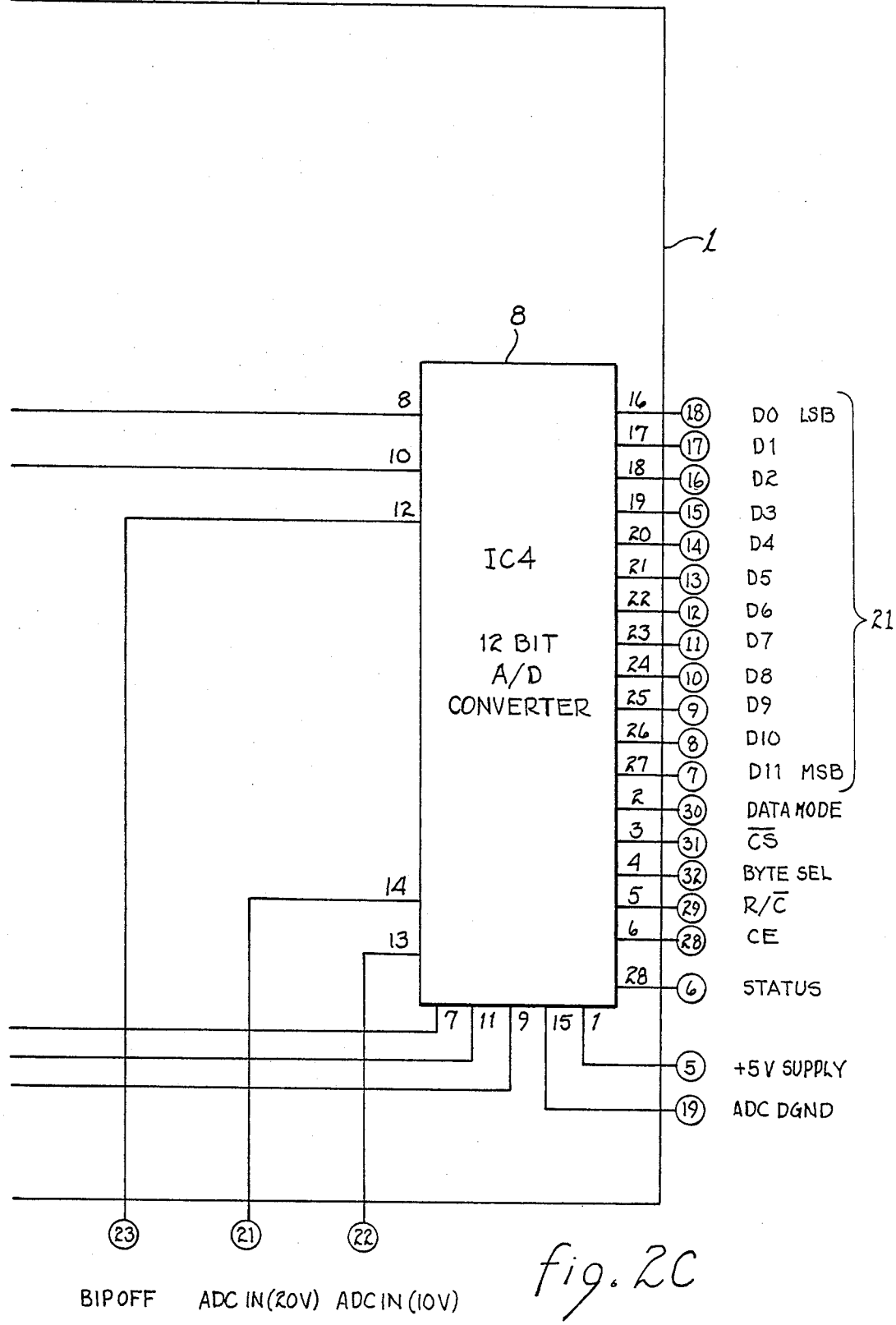

With reference now to FIGS. 2A–2C, a circuit schematic of the surface-mounted single package data acquisition system (D.A.S.) 1 of the present invention is shown. The circled numbers around the periphery of D.A.S. 1 represent the I/O connectors 1–68. Reference may be had to Appendix A attached hereto for the identity of the signals appearing on I/O pins 1–68 of the D.A.S. 1.

In the upper portion of FIG. 2A is shown multiplexer 2 in the form of an integrated circuit. In a preferred embodiment of the invention, in the single-ended version of the system, multiplexer 2 is a MUX-16, commercially available from Precision Monolithics, Inc. In the dual input version of the system, multiplexer 2 is a MUX-28, also commercially available from Precision Monolithics, Inc. The 28 I/O pins of multiplexer 2 are each labelled in FIG. 2A.

In the single-ended version of the system, multiplexer 2 receives one of sixteen analog inputs labelled as channel 0 through channel 15, indicated by reference numerals 3 and 7 in FIG. 2A. In the dual input version of the system, multiplexer 2 receives a pair of input signals, one from group 3 labelled as channel 0+ through channel 7+, and the other from group 7 labelled through channel 0− through channel 7−.

Multiplexer 2 also receives other externally generated signals in the form of multiplexer address signals and a multiplexer enable signal. The single-ended version of the system contains signal inputs MUX ADD 0 through MUX ADD 3, while the dual input version contains address signals MUX ADD 0 through MUX ADD 2. These address lines serve to select one channel or channel pair for sampling.

In the single-ended version of the system, the multiplexer output is available on pin 65. In the dual input version of the system, the positive multiplexer output is available on pin 65, while the negative multiplexer output is available on pin 67.

A plus 15 volt source is supplied to multiplexer 2 and to instrumentation amplifier 4 via DAS I/O pin 3. A minus 15 volt source is supplied by D.A.S. I/O pin 4. D.A.S. I/O pin 53 is coupled to ground.

In the upper portion of FIG. 2B is shown instrumentation amp 4 in the form of an integrated circuit. In a preferred embodiment of the invention, instrumentation amp 4 is a precision instrumentation amplifier referred to as the INA110, commercially available from Burr-Brown Corporation. The 13 I/O pins of instrumentation amp 4 are labelled in FIG. 2B.

Instrumentation amp 4 receives an AMP IN+ input signal direct from multiplexer 2 and an AMP IN− input signal via D.A.S. I/O pin 66. It also receives gain control signals RG, G10, and G100 via D.A.S. I/O pins 62–64, respectively. It also receives an AMP REF signal via D.A.S. I/O pin 2.

Instrumentation amp 4 generates an AMP OUT signal via D.A.S. I/O pin 1. An AMP SENSE signal on pin 68 is used to sense the amplifier output voltage to correct for any voltage errors caused by current flow.

In the lower portion of FIG. 2A is shown the sample-and-hold amp 6 in the form of an integrated circuit. In a preferred embodiment of the invention, sample-and-hold amp 6 is the SMP-11, commercially available from Precision Monolithics, Inc. The 13 I/O pins of sample-and-hold amp 6 are labelled in FIG. 2A.

Sample-and-hold amp 6 is responsive to the signals S/H GROUND, S/H IN, and S/H CONTROL, via D.A.S. I/O pins 34, 39, and 33, respectively. The circuit also receives a +15 volt source, a −15 volt source, and an "A ground" source, via D.A.S. I/O pins 27, 20, and 25, respectively.

Sample-and-hold amp 6 generates a S/H OUT signal via D.A.S. I/O pins 35 and 37, and a HOLD CAPACITOR signal via I/O pin 36. Two S/H outputs are provided to allow for a "guard ring" on pin 36.

In the right-hand portion of FIG. 2C is shown the A/D converter 8 in the form of an integrated circuit. In a preferred embodiment of the invention, A/D converter 8 is an ADC574 or ADC674, commercially available from Harris Corporation. The 28 I/O pins of A/D converter 8 are labelled in FIG. 2C.

A/D converter 8 generates a twelve-bit digital output signal 21, represented by output lines D0 (LSB) through D11 (MSB). The 12-bit output may be split into an 8-bit output and a 4-bit output under the control of the DATA MODE pin 30.

A/D converter 8 receives an REF IN signal, an ADC IN signal (20 volts), and an ADC IN signal (10 volts) via D.A.S. I/O pins 24, 21, and 22, respectively. The circuit also receives a BIPOFF signal via I/O pin 23. The circuit generates a REF OUT signal via D.A.S. I/O pin 26.

A/D converter 8 receives as a control input thereto a DATA MODE signal, a CHIP SELECT signal, a BYTE SELECT signal, an R/C signal, and a CHIP ENABLE signal, respectively. The circuit generates a STATUS control signal via I/O pin 6. The circuit is also coupled to a +5 volt supply and an ADC "D ground" via D.A.S. I/O pins 5 and 19, respectively.

Appendix B attached hereto provides a Control Input Truth Table setting forth the operations performed by A/D converter 8 as determined by various combinations of the CE, CS, R/C, DATA MODE, and BYTE SELECT control inputs.

Figure 3A:
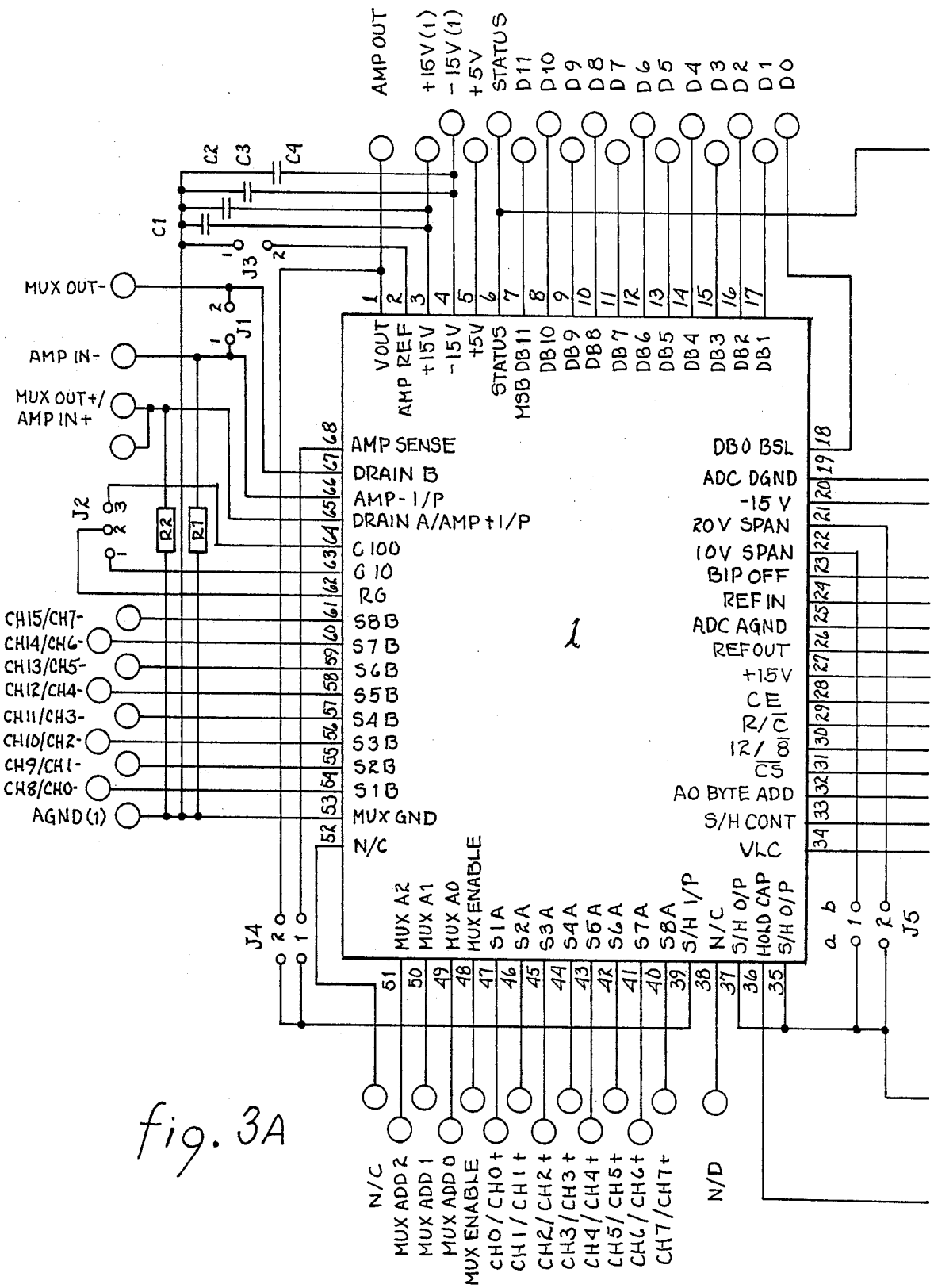
FIGS. 3A and 3B together show a circuit diagram of a data acquisition system incorporating the present invention.
Figure 3B:
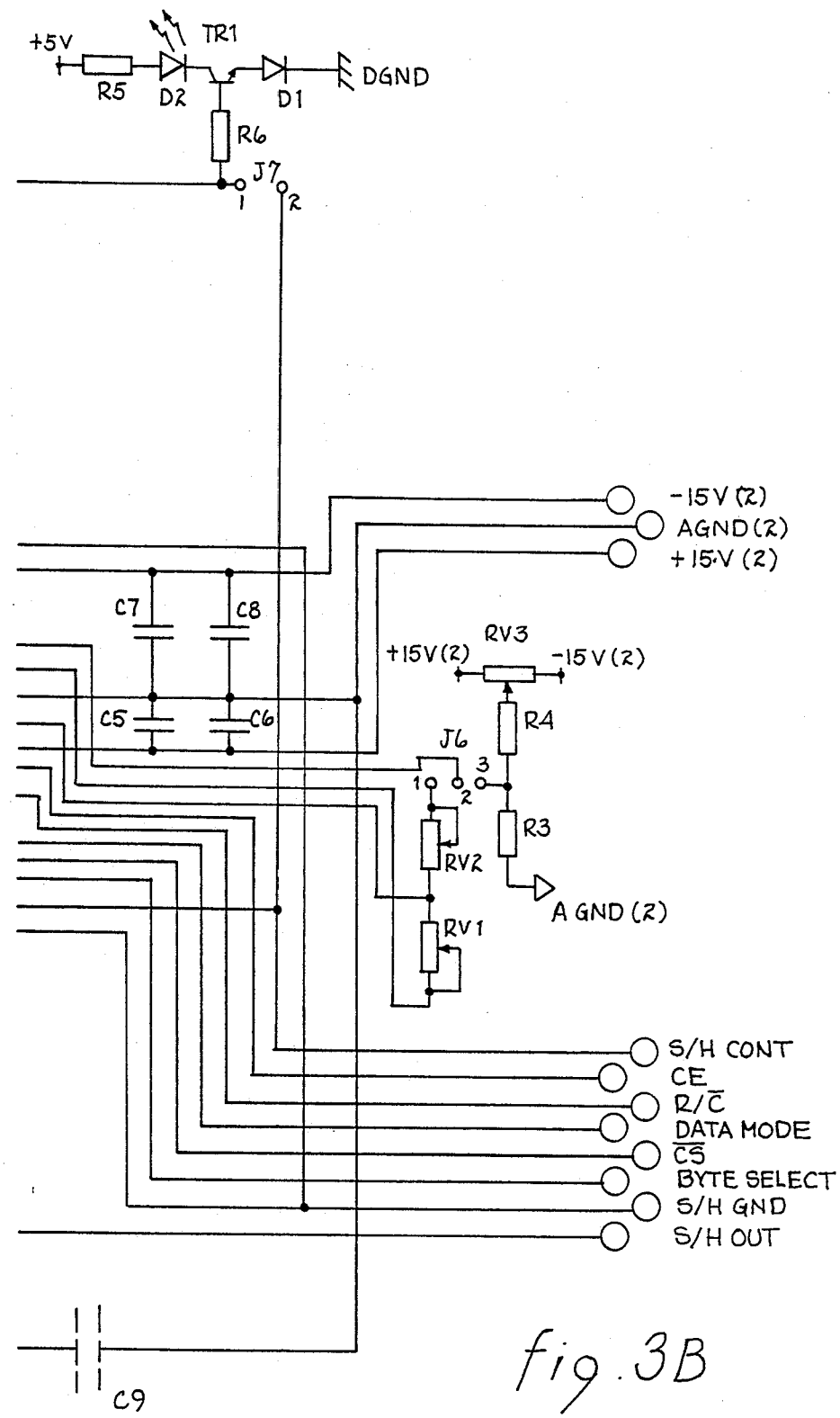

With reference now to FIGS. 3A and 3B, a circuit diagram of a data acquisition system 1 incorporating the present invention is shown. The circuit diagram of FIGS. 3A and 3B represents but one possible implementation of a data acquisition system utilizing the single package D.A.S. circuit of the present invention in connection with external compounds of the user's choice to achieve a desired data acquisition objective.

The implementation shown in FIGS. 3A and 3B may be used, for example, for the purpose of providing a versatile multi-channel analog-to-digital conversion system.

This implementation utilizes external resistors R1–R6, variable resistors RV1–RV3, capacitors C1–C9, jumpers J1–J7, transistor TR1, diode D1, LED D2, and potential sources of +5, +15, −15, and 0 volts.

The function of variable resistors RV1–RV3 is to remove offset and gain errors—i.e. to calibrate the system.

The function of jumper J1 is to remove the connection between the multiplexer 2 and the instrumentation amplifier 4 negative signal for test purposes.

The function of jumper J2 is to set the gain of the system.

The function of jumper J3 is to apply an analog ground reference to instrumentation amplifier 4.

The function of jumper J4 is to connect the sense input of the amplifier 4 to the output to ensure that no errors are introduced at the amplifier 4 output. The function of jumper J5 is to select the A/D converter input range.

The function of jumper J6 is to select unipolar or bipolar input range to the A/D converter 8.

The function of jumper J7 is to allow A/D converter status to control the S/H amplifier 6.

The function of capacitors C1-C8 is to decouple the input power supplies.

Capacitors C9 functions as an external storage means for the sample-and-hold amplifier 6.

The function of the portion of the circuit comprising transistor TR1, diode D1, LED D2, and resistors R5 and R6 is to indicate visually that a conversion is in progress.

Figure 4A:
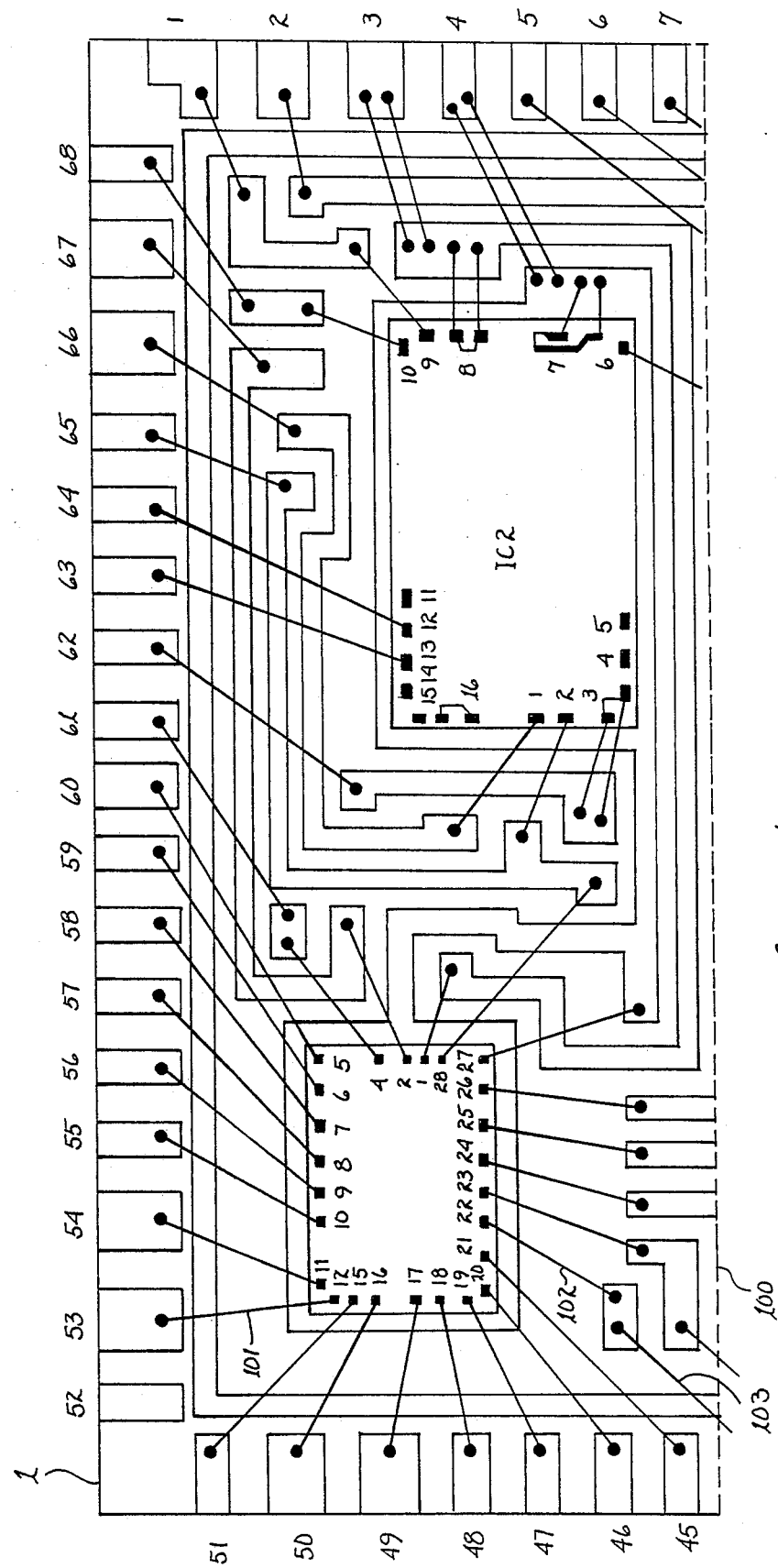
FIGS. 4A and 4B together show a layout diagram illustrating the physical and electrical relationships between the components of the surface-mounted single package data acquisition system of the present invention.
Figure 4B:
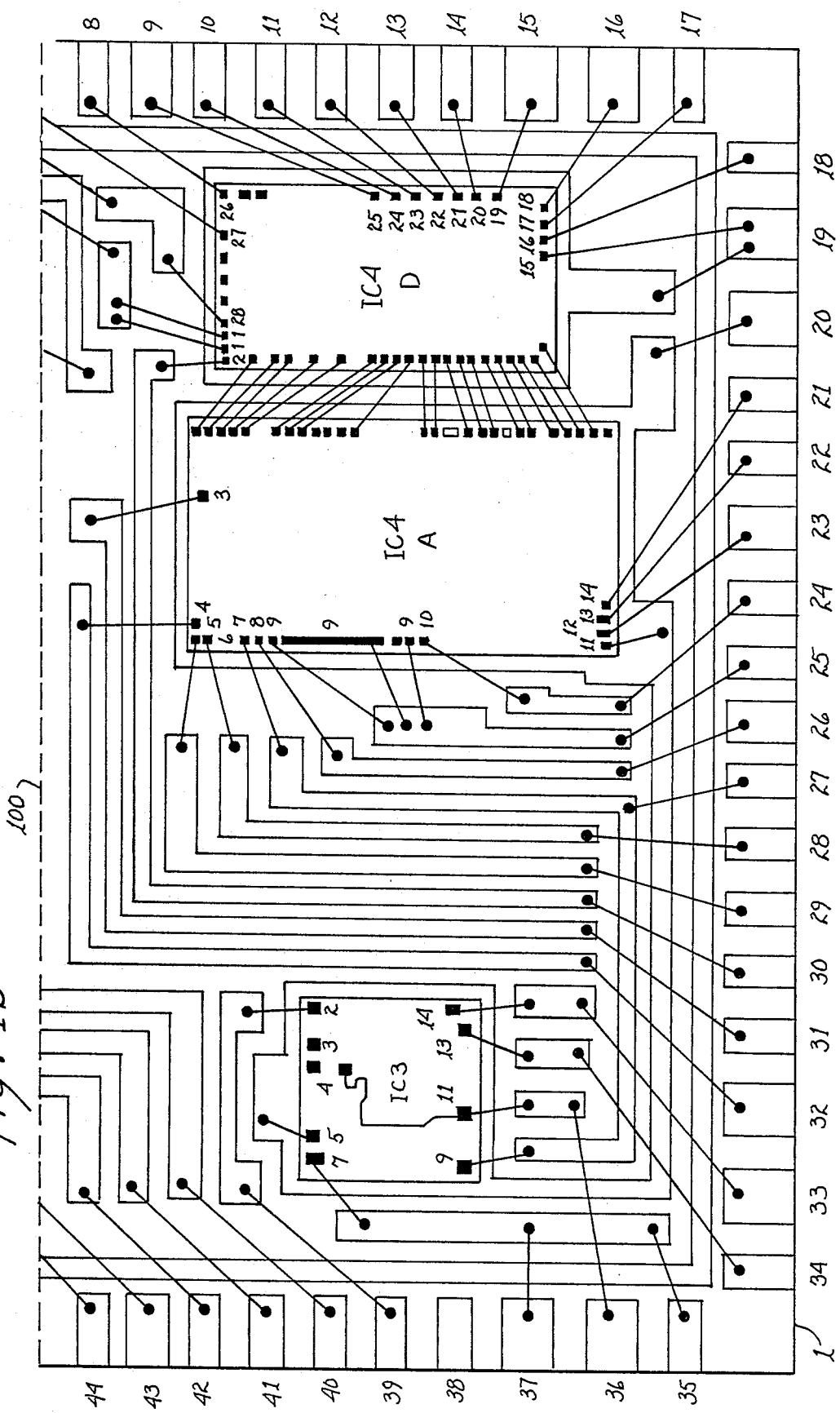

With reference to FIGS. 4A and 4B, there is shown a layout diagram illustrating the physical and electrical relationships between the component of the surface-mounted single package data acquisition system of the present invention. It will be understood that FIG. 4A is joined to FIG. 4B along broken line 100.

Apparent in FIGS. 4A and 4B are the five integrated circuits labelled "IC 1", "IC 2", "IC 3", "IC4A", and "IC4D", as well as the conductive paths associated with the substrate 1.

Around the periphery of the substrate 1 are dispersed bonding pads 1-68 for coupling the D.A.S. 1 to an external circuit package. In a preferred embodiment of the invention the substrate 1 and 68 bonding pads form part of what is known in the packaging technology as a "leadless chip carrier". Such package may conveniently be electrically and physically connected to the next higher level of packaging integration by appropriate surface mounting, such as flow soldering, for example.

It will be also be understood that appropriate leads could be utilized instead of bonding pads 1-68, such leads generally protruding outwardly from substrate to facilitate connection to an external package.

As seen from FIG. 4A, appropriate wire bonds, such as wire 101, are used to couple the substrate bonding pads (e.g. pad 53) to the bonding pads of the integrated circuits (e.g. pad 12 of IC 1). Also, wires such as wires 102 and 103 are used to make the connection between the integrated circuit pads and the substrate conductors, and between the substrate bonding pads and the substrate conductors.

The resulting circuit package is extremely compact, measuring approximately one inch (25.4 millimeters) on a side and approximately 0.118 inches (3.0 millimeters) in thickness.

OPERATION OF PREFERRED EMBODIMENT

In operation, with reference to FIGS. 2A-2C, input channels of multiplexer 2 are selected using the appropriate logic levels on address lines ADD 0 through ADD 2/ADD 3.

The multiplexer outputs are input into the instrumentation amp 4. As mentioned above, the gain of instrumentation amp 4 is selectable using I/O pins 62-64 in ranges of 1, 10, and 100, using only an external jumper (without using an external resistor).

Next the sample-and-hold amp 6 latches the analog value received from the instrumentation amp 4, in response to the S/H control signal on I/O pin 33. This signal can be generated by the status line (I/O pin 6) from the A/D converter 8 or by an external timing circuit.

The output of the sample-and-hold amp 6 is coupled to one of two span inputs on the A/D converter 8. The A/D converter 8 has a full microprocessor interface, comprising data lines D0-D11 which can be tri-stated, Chip Select, the option of 8-bit or 12-bit data-width transfers, and a status output to enable handshaking with other components such as a microprocessor.

The D.A.S. can operate either in serial mode, wherein a channel is selected, and time is allowed for the amplifier to settle, and the analog value is latched into the sample-and-hold amp, and finally the A/D converter carries out the conversion, or in overlap mode, wherein the analog value latched into the sample-and-hold amp is being converted to a digital value while the next multiplexer channel is being selected.

It should be noted that the multiplexer 2 can be disabled using the MUX ENABLE input, so that an external multiplexer could be coupled to D.A.S. I/O pins 65 and 67. The multiplexer channel address is not latched by the multiplexer 6, so that the other channel selection techniques can be used, e.g. a counter.

It should also be observed that the voltage reference, internal clock circuitry, and multiplexer channel decoding circuitry are all contained on the D.A.S. 1.

It will be apparent to those skilled in the art that the disclosed surface-mounted single package data acquisition system may be modified in numerous ways and may assume many embodiments other than the preferred form specifically set out and described above.

APPENDIX A

| | I/O PINOUT OF D.A.S. PACKAGE | |
| --- | --- | --- |
| PIN | SIGNAL | FUNCTION |
| 1 | V OUT (AMP OUT) | Output of instrumentation amplifier. Should be connected to input of the S/H amplifier. |
| 2 | AMP REFERENCE | Normally connected to analog ground. |
| 3 | + 15 VOLTS (1) | Connected to +15 volt supply. |
| 4 | − 15 VOLTS (1) | Connected to −15 volt supply. |
| 5 | + 5 VOLTS | Logic supply voltage, connected to +5 digital supply line. |
| 6 | STATUS OF A/D CONVERSION | This output pin is a logical 1 while the A/D converter is carrying out a conversion. This pin may be used to directly control the S/H amplifier. |
| 7 | DATA LINE 11 | The 12-bit or 8-bit result |
| 8 | DATA LINE 10 | of a conversion is available |
| 9 | DATA LINE 9 | as a tri-state digital output |
| 10 | DATA LINE 8 | on data lines 0-11. |
| 11 | DATA LINE 7 | |
| 12 | DATA LINE 6 | |
| 13 | DATA LINE 5 | |

APPENDIX A-continued
I/O PINOUT OF D.A.S. PACKAGE

| PIN | SIGNAL | FUNCTION |
|---|---|---|
| 14 | DATA LINE 4 | |
| 15 | DATA LINE 3 | |
| 16 | DATA LINE 2 | |
| 17 | DATA LINE 1 | |
| 18 | DATA LINE 0 | |
| 19 | ADC GROUND | Reference for A/D converter control lines. Connected to digital ground. |
| 20 | − 15 VOLTS (2) | |
| 21 | ADC IN (20 VOLTS) | Pins 21 and 22 are inputs to A/D converter from S/H amp. Use appropriate pin for desired range. |
| 22 | ADC IN (10 VOLTS) | |
| 23 | BIP OFF | A voltage applied to this pin (normally 10 volts from REF OUT) offsets the A/D converter for bipolar operation. |
| 24 | REF IN | Reference for the A/D converter (normally input from REF OUT). |
| 25 | ANALOG GROUND (2) | Analog ground for the A/D converter. |
| 26 | REF OUT | Output of the A/D converter on-chip reference (nominally 10 volts). |
| 27 | + 15 VOLTS (2) | |
| 28 | CHIP ENABLE (CE) | This input must be a logical 1 to either initiate a conversion or to read output data. |
| 29 | READ/CONVERT (R/C) | When this pin is high, data can be read from the tri-state buffers of the A/D converter; when low, a conversion can be initiated. |
| 30 | DATA MODE | Selects whether 12-bit or 8-bit data is read from the A/D converter. When a logical 1, all 12 output data bits are enabled simultaneously; when a logical 0 the MSB's and LSB's are controlled by Byte Select (pin 32). |
| 31 | CHIP SELECT (CS) | This input must be at a logical 0 to either initiate a conversion or to read output data. |
| 32 | BYTE SELECT | When reading output data, Byte Select = 0 enables the 8 MSB's, and Byte Select = 1 enables the 4 LSB's. The 4 LSB's can therefore be connected to four of the MSB lines for interconnection to an 8-bit bus. In Start convert mode, Byte Select = 0 enables a 12-bit conversion, while Byte Select = 1 will short cycle the conversion to 8 bits. |
| 33 | TRACK/HOLD CONTROL ON S/H AMPLIFIER | A logical 1 on this pin holds an analog value for conversion by the A/D converter. This line may be controlled by the status signal of the A/D converter to simplify external timing control. |
| 34 | S/H GND. | Reference for S/H logic control. Connected to digital ground. |
| 35 | S/H OUT | Output of S/H amplifier. Pins 35 and 37 are provided to facilitate a guard ring around the hold capacitor pin. |
| 36 | HOLD CAPACITOR | Connection for hold capacitor on S/H amp. |
| 37 | S/H OUT | See pin 35 definition. |
| 38 | NO CONNECTION (N/C) | |
| 39 | SAMPLE/HOLD IN | Input to S/H amp. |
| 40 | CH 7 / CH 7+ | Analog inputs. |
| 41 | CH 6 / CH 6+ | |
| 42 | CH 5 / CH 5+ | |
| 43 | CH 4 / CH 4+ | |
| 44 | CH 3 / CH 3+ | |

APPENDIX A-continued

I/O PINOUT OF D.A.S. PACKAGE

| PIN | SIGNAL | FUNCTION |
|---|---|---|
| 45 | CH 2 / CH 2+ | |
| 46 | CH 1 / CH 1+ | |
| 47 | CH 0 / CH 0+ | |
| 48 | MUX ENABLE | A logic 1 on this pin will enable a selected channel on the internal multiplexer; a logical 0 deselects all channels. |
| 49 | MUX ADD 0 | Address lines MUX ADD 0-2 select a particular channel. |
| 50 | MUX ADD 1 | |
| 51 | MUX ADD 2 | |
| 52 | N0 CONNECTION | (dual-channel version) |
|    | MUX ADD 3 | (single-ended version) |
| 53 | AGND (1) | Analog ground for the multiplexer. |
| 54 | CH 8 / CH 0- | Analog inputs. |
| 55 | CH 9 / CH 1- | |
| 56 | CH 10 / CH 2- | |
| 57 | CH 11 / CH 3- | |
| 58 | CH 12 / CH 4- | |
| 59 | CH 13 / CH 5- | |
| 60 | CH 14 / CH 6- | |
| 61 | CH 15 / CH 7- | |
| 62 | RG | The pin to which G10 and G100 are jumpered for gains of 10 and 100, respectively. |
| 63 | G10 | Connect to RG for gain of 10. |
| 64 | G100 | Connect to RG for gain of 100. |
| 65 | MUX OUT+/AMP IN+ (MULTIPLEXER "HI" OUTPUT) | There is an internal connection between the positive output terminals of the dual channel multiplexer and the positive input terminal of the instrumentation amplifier. This pin is available for multiplexer channel expansion. |
| 66 | AMP IN- | Negative input terminal of instrumentation amplifier. |
| 67 | MUX OUT- (MULTIPLEXER "LO" OUTPUT) | Negative output of dual multiplexer. (NO CONNECTION on on single-ended version.) |
| 68 | AMP SENSE | An input to instrumentation amplifier which senses true value of output voltage. Normally tied to Amp Out (pin 1). |

APPENDIX B

CONTROL INPUT TRUTH TABLE

| CE | CS | R/C | DATA MODE | BYTE SELECT | OPERATION |
|---|---|---|---|---|---|
| 0 | X | X | X | X | NONE |
| X | 1 | X | X | X | NONE |
| ↑ | 0 | 0 | X | 0 | INITIATE 12-BIT CONVERSION |
| ↑ | 0 | 0 | X | 1 | INITIATE 8-BIT C0NVERSION |
| 1 | 0 | 0 | X | 0 | INITIATE 12-BIT CONVERSION |
| 1 | ↓ | 0 | X | 1 | INITIATE 8-BIT CONVERSION |
| 1 | 0 | ↓ | X | 0 | INITIATE 12-BIT CONVERSION |
| 1 | 0 | ↓ | X | 1 | INITIATE 8-BIT CONVERSION |
| 1 | 0 | 1 | 1 | X | ENABLE 12-BIT OUTPUT |
| 1 | 0 | 1 | 0 | 0 | ENABLE 8 MSB's ONLY |
| 1 | 0 | 1 | 0 | 1 | ENABLE 4 LSB's + 4 TRAILING ZEROES. |

↑ = High-going edge
↓ = Low-going edge

What is claimed is:

1. A data acquisition system physically packaged for surface mounting, said system comprising:
   (a) a first integrated circuit chip means for selectively receiving, in response to a control signal, one of n pairs of analog signal inputs and generating a resultant analog signal;
   (b) a second integrated circuit chip means for amplifying said analog signal;
   (c) a third integrated circuit chip means for temporarily storing said amplified analog signal;
   (d) a fourth integrated circuit chip means for converting said amplified analog signal into a digital signal for proportionate value; and (e) a single substrate of non-conducting material, said single substrate measures less than two (2) inches on a side, said substrate being used for mounting said first, second, third and fourth integrated circuit chip means, said first, second, third, and fourth integrated circuit chip means being provided with bonding pads, said single substrate being provided with peripheral bonding pads and substrate conductors, said first, second, third, and fourth integrated circuit chip means being electrically interconnected using wirebonding methods to said substrate conductors and to said substrate bonding pads, said peripheral bonding pads forming part of a leadless chip carrier for surface mounting said data acquisition system to a next higher level of packaging integration.

2. The date acquisition system as recited in claim 1, wherein said single substrate, having said first, second, third, and fourth integrated circuit chip means mounted thereon, is provided in a hermetically sealed package.

3. The date acquisition system as recited in claim 1, wherein said peripheral substrate bonding pads are provided in a quantity of 68 peripheral bonding pads, said 68 peripheral bonding pads also forming part of a leadless chip carrier package which is surface mounted to a next level of packaging integration by flow soldering.

4. A data acquisition system physically packaged for surface mounting, said system comprising:
(a) a first integrated circuit chip means for selectively receiving, in response to a control signal, one of n pairs of analog signal inputs and generating a resultant analog signal;
(b) a second integrated circuit chip means for amplifying said analog signal;
(c) a third integrated circuit chip means for temporarily storing said amplifier analog signal;
(d) a fourth integrated circuit chip means for converting said amplified analog signal into a digital signal of proportionate value;
(e) a single substrate of non-conducting material, said single substrate measuring less than two (2) inches on a side, said substrate being used for mounting said first, second, third and fourth integrated circuit chip means, said first, second, third, and fourth integrated circuit chip means being provided with bonding pads, said single substrate being provided with peripheral bonding pads and substrate conductors, said first, second, third, and fourth integrated circuit chip means being electrically interconnected using wirebonding methods to said substrate conductors and to said substrate bonding pads, said peripheral bonding pads forming part of a leadless chip carrier for surface mounting said data acquisition system to a next higher level of packaging integration; and
(f) a hermetically sealed package enclosing said single substrate having said first, second, third, and fourth integrated circuit chip means mounted thereon.

5. The date acquisition system as recited in claim 4, wherein said peripheral substrate bonding pads are provided in a quantity of 68 peripheral bonding pads, said 68 peripheral bonding pads also forming part of a leadless chip carrier package which is surface mounted to a next level of packaging integration by flow soldering.

* * * * *